United States Patent [19]
Levine et al.

[11] Patent Number: 5,506,419
[45] Date of Patent: Apr. 9, 1996

[54] QUANTUM WELL PHOTODETECTOR WITH PSEUDO-RANDOM REFLECTION

[75] Inventors: Barry F. Levine, Livingston, N.J.; Gabby Sarusi, Rishon-Lezion, Israel

[73] Assignee: AT&T Corp., Murray Hill, N.J.

[21] Appl. No.: 336,946

[22] Filed: Nov. 10, 1994

[51] Int. Cl.$^6$ .................... H01L 29/06; H01L 31/0328; H01L 31/0336
[52] U.S. Cl. .................... 257/17; 257/21; 257/22; 257/432; 257/436
[58] Field of Search .................... 257/21, 17, 22, 257/436, 432, 184

[56] References Cited

U.S. PATENT DOCUMENTS 5,272,356  12/1993  Wen et al. .................... 257/432 X
5,282,902   2/1994  Matsuyama .................... 257/436 X

FOREIGN PATENT DOCUMENTS 4201126  6/1992  Germany .................... 257/432

Primary Examiner—William Mintel
Attorney, Agent, or Firm—John M. Harman

[57] ABSTRACT

Quantum well infrared photodetectors (QWIPs) according to the invention have a surface that provides pseudo-random reflection of the radiation that is incident thereon, resulting in an increase in the effective number of passes of the radiation through the quantum well region, and hence in increased responsivity of the QWIPs, as compared to corresponding prior art grating QWIPs. A convenient approach to forming the pseudo-random reflecting surface is disclosed.

9 Claims, 3 Drawing Sheets

QUANTUM WELL PHOTODETECTOR WITH PSEUDO-RANDOM REFLECTION

FIELD OF THE INVENTION

This invention pertains to semiconductor photodetectors, in particular, to quantum well infrared photodetectors (QWIPs).

BACKGROUND OF THE INVENTION

QWIPs are known (see, for instance, U.S. Pat. Nos. 4,894,526 and 5,023,685), and are very promising devices, especially in array form. However, QWIPs have not yet found widespread commercial use, due at least in part to the relatively low optical coupling of conventional devices, which results in relatively low responsivity and detectivity of the devices. It thus would be highly desirable to have available QWIPs with improved optical coupling. This application discloses such QWIPs.

For reasons that are well known to those skilled in the art, prior art QWIPs comprise a feature or features that insures that the optical electric field in the quantum well (QW) region has a component that is normal to the plane of the QWs. See, for instance, G. Sarusi et al., *Applied Physics Letters*, Vol. 64(8), p. 960 (Feb. 21, 1994), incorporated herein by reference. Thus, QWIP arrays conventionally comprise 1-dimensional or 2-dimensional gratings to provide this electric field component and to enhance optical coupling by causing the effective radiation to pass more than once through the QW region. However, the number of passes obtainable by means of even a 2-dimensional grating is small, namely two. See FIG. 1a of Sarusi et al. (op. cit.), and discussion pertaining thereto. See also J. Y. Andersson, *Applied Physics Letters*, Vol. 58, p. 2264 (1991).

It is known that the external quantum efficiency of LEDs can be substantially increased by texturing of the surface of the LED, such that angular randomization of the radiation is achieved by strong surface scattering. See I. Schnitzer et al., *Applied Physics Letters*, Vol. 63(16), p. 2174 (Oct. 18, 1993).

It is also known that the performance of a solar cell can be enhanced by provision of a textured surface that results in substantial randomization of the optical radiation. See E. Yablonovitch et al., *IEEE Transactions on Electron Devices*, Vol. ED-29 (2), p. 300 (1982).

DEFINITIONS

Herein a surface is considered to reflect radiation incident thereon "pseudo-randomly" if either the surface reflects substantially randomly, or if the surface reflects such that the amount of radiation reflected in-phase and out-of-phase with the incident radiation is substantially equal, i.e., the amount of out-of-phase radiation is in the range 0.5–2 times the amount of in-phase radiation. Such a pseudo-random surface will produce a wide angular distribution of scattered radiation.

SUMMARY OF THE INVENTION

In a broad aspect the invention is embodied in an article that comprises an improved quantum well photodetector. More specifically, the improved detector is adapted for detecting radiation that is incident on a first major surface of the photodetector, and comprises a semiconductor superlattice comprising at least one quantum well, and further comprises contact means for electrically biasing the superlattice and for sensing an electrical signal in response to radiation incident on the first surface. The detector also has a second major surface that is also essentially parallel to the quantum well and is spaced from the first surface. The quantum well is disposed between the first and second surfaces. Significantly, at least a portion of the second surface is patterned to pseudo-randomly reflect at least a major portion of the radiation that is incident thereon from the first surface, such that the effective number of passes of said radiation through the quantum well is greater than 2, as demonstrated by increased absorption of the radiation in the device according to the invention, as compared to an otherwise identical prior art QWIP with a 2-dimensional grating instead of the pseudo-randomly reflecting surface.

In preferred embodiments the article comprises an array of quantum well photodetectors according to the invention, and patterning of the second surface of a given member of the array (pixel) involves patterning of a processing layer on the second surface. In a particular preferred embodiment the patterned second surface of the pixel comprises a multiplicity of patterning unit cells, with a given unit cell differing from at least some of the other unit cells of the pixel.

It is to be understood that neither the first nor the second surface necessarily is a direct interface with the ambient. For instance, the optional presence of a transparent protective layer on the first surface is contemplated, as is the presence of a reflecting layer (e.g., Au) on the patterned second surface.

No attempt has been made to show actual dimensions and proportions.

DETAILED DESCRIPTION OF EXEMPLARY EMBODIMENTS

Figure 1:
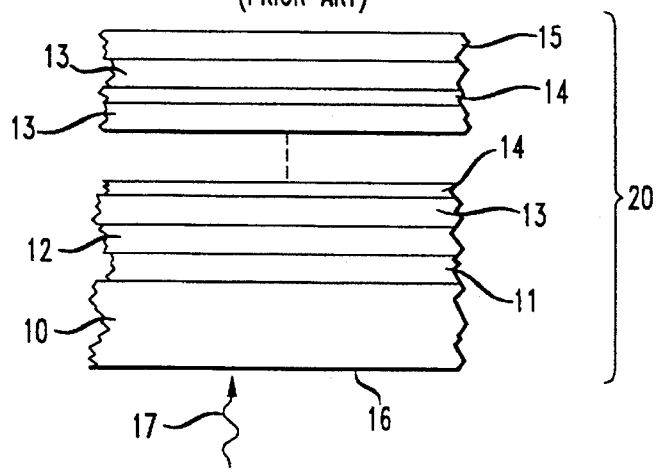
FIG. 1 schematically depicts the semiconductor layer structure of a prior art QWIP.

FIG. 1 shows the semiconductor layer structure of a conventional QWIP, wherein numerals 10–15 designate, respectively, the GaAs substrate, (undoped, semi-insulating), GaAs buffer layer (1 µm, undoped), GaAs contact layer (1 µm, $3\times10^{17}$ cm$^{-3}$ Si), $Al_{0.1}Ga_{0.9}As$ barrier layer (60 nm, undoped), GaAs quantum well (7.2 nm, $3\times10^{17}$ cm$^{-3}$ Si), and GaAs top contact layer (1 µm, $3\times10^{17}$ cm$^{-3}$ Si). The barrier/QW sequence is repeated several (e.g., 50) times. More or fewer periods than 50 may be advantageous for some applications. Numerals 16 and 17 designate the first surface and the incident radiation, respectively. As those skilled in the art will know, formation of the QWIP includes making ohmic contact to the contact layers. QWIPs are not necessarily GaAs-based and could, for instance, be InP-based.

Figure 2:
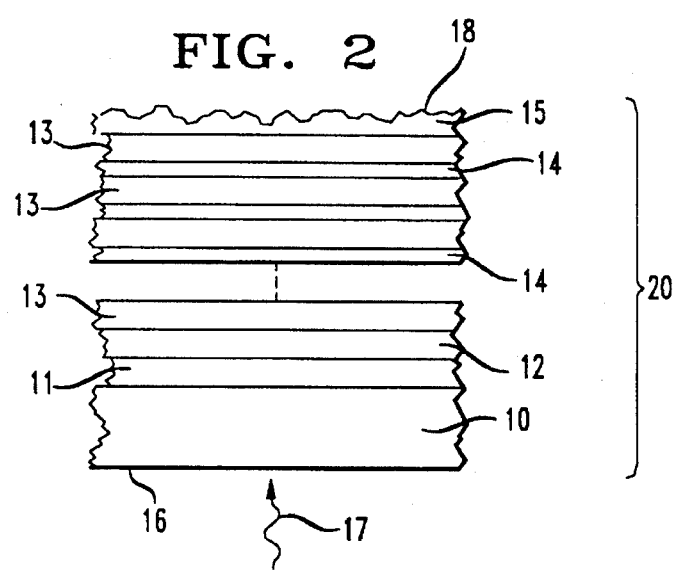
FIG. 2 shows schematically an exemplary QWIP according to the invention comprising pseudo-random reflection means.

FIG. 2 schematically depicts a, currently not preferred, embodiment of the invention, wherein the layer structure (20) can be as shown in FIG. 1, but second surface (18) of the layer structure is modified to randomly scatter radiation incident thereon from the first surface. The second surface can be modified (i.e., roughened), by any appropriate physical (e.g., polishing with rough grit, sandblasting) or chemical (e.g., reactive ion etching) means. Desirably the roughness scale is somewhat larger than the peak wavelength of the radiation (17) in the layer material adjacent to the second surface.

Figure 3:
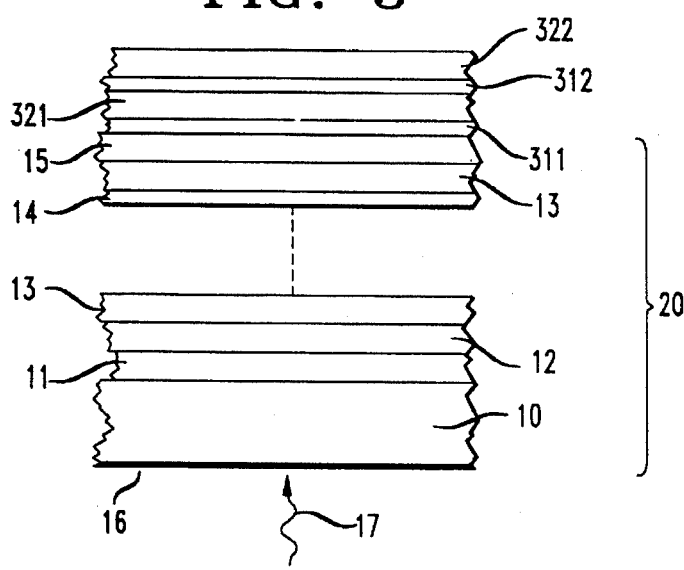
FIG. 3 schematically shows the semiconductor layer structure of another QWIP according to the invention.

FIG. 3 schematically shows the layer structure of an exemplary preferred embodiment of the invention. On conventional contact layer 15 is deposited by conventional means stop-etch layer 311, (30 nm $Al_{0.1}Ga_{0.9}As$, $3\times10^{17}$ $cm^{-3}$ Si) followed by GaAs layer 321 ($\lambda'_p/4$, $3\times10^{17}$ $cm^{-3}$ Si) stop-etch layer 312 (same as 311), and GaAs layer 322 (same as 321). The thickness of layers 321 and 322 depends on the peak wavelength in the semiconductor material ($\lambda'_p$) of the radiation that is to be detected, as will be explained in detail below. The layer structure of FIG. 3 is adapted for formation of a three-level pseudo-random scattering surface. Two-level pseudo-random scattering surfaces are possible and are contemplated, as are surfaces with more than three levels. For instance, in the case of a two-level scattering surface the layer structure would comprise one GaAs layer and one stop-etch layer. It will be appreciated that stop-etch layers are provided for case of manufacture and are optional.

Currently preferred embodiments of the invention utilize "patterning unit cells" to achieve pseudo-random scattering from the second surface. The concept of the patterning unit cell is illustrated in FIGS. 4–6.

Typically patterning unit cells are of square shape, of size $U^2$. FIG. 4 shows a particular three-level unit cell in top view. Numerals 41–43 designate three sub-regions of the second surface in the unit cell, with regions 41 and 43 each being of size $U^2/4$, and region 42 being of size $U^2/2$. FIG. 5 schematically shows the same unit cell in side view. The surface of region 41 is a distance $\lambda'_p/2$ below the level of surface 43, and the surface of level 42 is a distance $\lambda'_p/4$ above the level of surface 41, where $\lambda'_p$ is the peak wavelength in the medium of the radiation that is to be detected. As those skilled in the art will recognize, radiation reflected from the surface of 43 will be in phase ($\lambda'_p$ path difference) with radiation reflected from 41, and both of these will be out of phase ($\lambda'_p/2$ path difference) with radiation reflected from surface 42. As can be seen, the areas of sub-regions 41–43 were selected such that the in-phase and out-of-phase scattering amplitudes would be nominally equal, in order to maximize the destructive interference of the small angle back reflected radiation.

Figure 4:
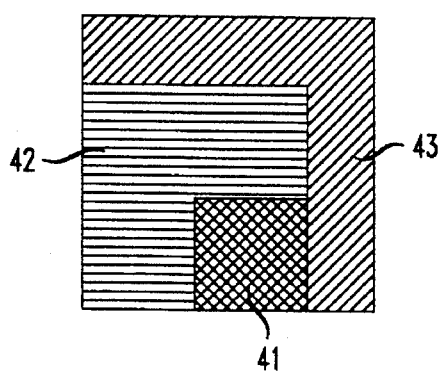
FIGS 4–6 illustrate a preferred approach to patterning the second surface of a QWIP according to the invention.
Figure 5:
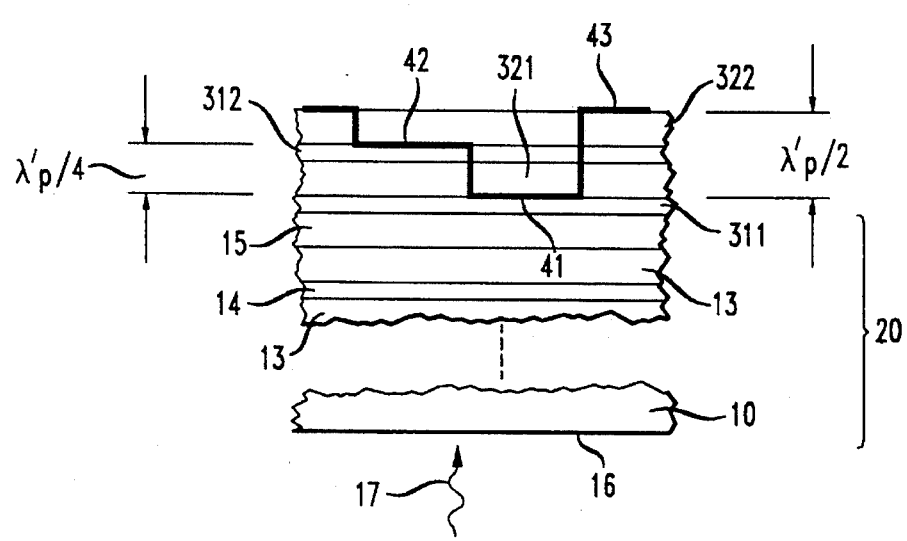
Figure 6:
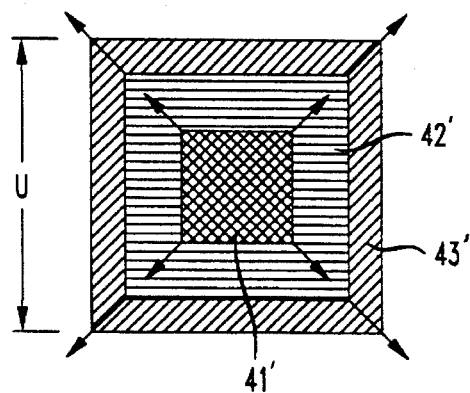

The exemplary unit cell of FIG. 4 is one of 16 particular unit cells that can be generated from the basic cell shown in FIG. 6 by "sliding" region 42' into one of the four outer corners of the cell, and by "sliding" region 41' into one of the four corners of 42'. It is thus readily possible to fabricate photolithographic masks for manufacturing QWIP arrays according to the invention. Typically the masks are created such that the second surface of all pixels of the array is essentially the same, with the second surface of each pixel comprising a multiplicity of patterning unit cells, the patterning unit cells randomly chosen from a multiplicity (e.g., 16) of equivalent unit cells.

Photolithographically patterned second surfaces of QWIPs according to the invention can be etched by known means. For instance, a GaAs sub-region can be etched away in a gas discharge of $CCl_2F_2$. This etching will essentially stop at the AlGaAs layer. The AlGaAs can then be etched using a non-selective gas discharge etch of $BCl_3$. Exemplarily, use of a gas pressure of 1 mTorr and −50 volt DC bias for both gases resulted in highly anisotropic, damage-free etching.

For a second surface as shown in FIGS. 4 and 5, the thickness of the semiconductor layer structure on the conventional QWIP structure advantageously is at least $\lambda'_p/2$. For instance, in GaAs (refractive index 3.6) at a peak wavelength of 10 µm, the thickness deskably is at least 1.4 µm. For a 2-level second surface, the thickness desirably is at least a quarter wavelength, e.g., at least 0.7 µm.

Figure 7:
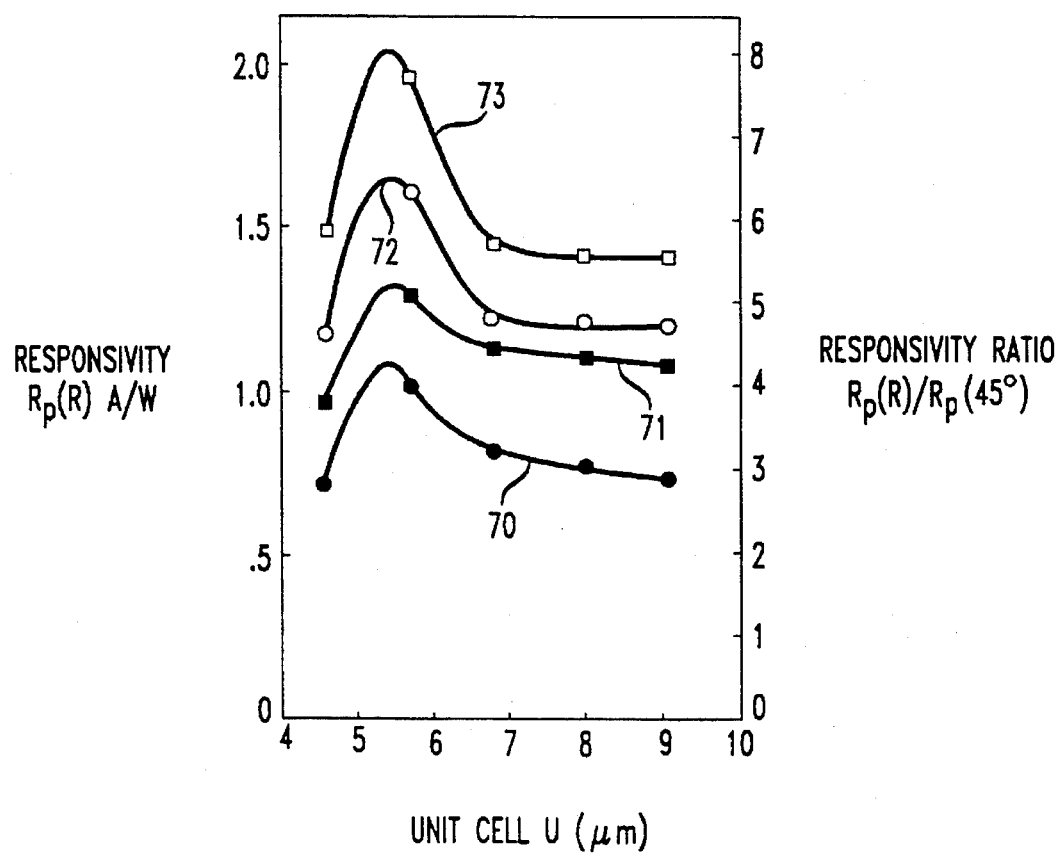
FIG. 7 shows data on responsivity vs. patterning unit cell size of an exemplary QWIP according to the invention.

We have also discovered that the size of the patterning unit cell is an important parameter. This is illustrated by FIG. 7, which shows responsivity of an exemplary QWIP according to the invention as a function of cell size U, for several values of substrate thickness t, with numerals 70–73 referring to curves for t=650, 150, 100 and 25 µm, respectively. As can be seen from FIG. 7, responsivity peaks for U~$\lambda'_p$, and in preferred embodiments U is in the range $\lambda'_p \pm 50\%$.

The preferred approach to patterning of the second surface of a photodetector according to the invention has been illustrated by means of square patterning unit cells containing sub-regions that are desired from square elements (see FIG. 6). Those skilled in the art will appreciate that this is not a requirement but merely a convenience. Unit cells of other shapes (e.g., rectangular, circular) are possible and are contemplated, as are sub-regions that are not derived from square elements, e.g., rectangular or hexagonal sub-regions. A requirement however is that the unit cell provides reflecting surfaces selected such that the amount of reflected radiation in phase with the incident radiation is substantially equal (preferably within a factor of 2) to the amount of radiation that is out-of-phase with the incident radiation.

As those skilled in the art will appreciate, the second surface of the layer structure is patterned as described above in selected regions that correspond to pixels in the QWIP array. Pixel size and spacing will depend on design objectives. Exemplarily, if the pixel size is 50 µm×50 µm, for $\lambda_p \cong 16.4$ µm, the masks for patterning of the pixel surface exemplarily provide for 10×10 patterning unit cells with U=5.0 µm (i.e., U~$\lambda'_p$).

After patterning of the pixel surface, the array of pixels is formed by a conventional mesa etch, and contacts to the pixels are formed. Exemplarily, the top contact to each 50 µm×50 µm mesa consisted of a small alloyed area (≦25 µm×25 µm) surrounded by a larger non-alloyed highly reflecting Au contact.

QWIPs as described above, with conventional 650 µm thick GaAs substrate and U~$\lambda'_p$ were found to have peak responsivity $R_p(R)>1$ A/W, nearly twice as much as the responsivity of corresponding prior art grating QWIPs.

Optical absorption in the QWIP can be further increased by provision of an optical cavity. This can be accomplished by inclusion of a reflecting layer (e.g., AlAs) in the semiconductor layer structure, e.g., between layers 11 and 12 in FIG. 1. However, our preferred approach involves thinning of the substrate. FIG. 7 shows the large improvement in responsivity that can be associated with appropriate thinning, exemplarily a factor of two increase for thinning from 650 µm to 25 µm. In preferred embodiments the thickness of the substrate is less than the pixel size, preferably less than 100 µm.

As can also be seen from FIG. 7, the QWIPs according to the invention in all cases had more than double the peak responsivity of the corresponding prior art QWIP with 45° incidence geometry (which is equivalent to the 1-dimensional grating QWIP), and therefore higher peak responsivity than the corresponding prior art 2-dimensional grating QWIP. This is indicative of the fact that in the QWIPs according to the invention the effective number of passes of the radiation through the QW superlattice is more than 2, and thus is greater than in prior art 2-dimensional grating QWIPs.

We claim:

1. An article comprising a quantum well photodetector adapted for detecting radiation that is incident on a first major surface of the photodetector, comprising a) a semiconductor superlattice comprising at least one quantum well, the quantum well being essentially parallel to said first surface;

b) contact means for electrically biasing the superlattice and for sensing an electrical signal in response to radiation incident on the first surface, wherein associated with the detector is a second major surface that is also essentially parallel to said quantum well and is spaced from the first surface, with the quantum well disposed between the first and second surfaces;

CHARACTERIZED IN THAT c) at least a portion of the second surface is patterned to pseudo-randomly reflect at least a major portion of the radiation incident thereon from the first surface, such that the effective number of passes of said radiation through the quantum well is greater than 2, the patterned portion of the second surface further comprising a plurality of patterning unit cells whereby a given patterning unit cell differs from the patterning unit of at least one of the other patterning unit cells and whereby all patterning unit cells remain essentially parallel to said quantum well.

2. An article according to claim 1, wherein the article comprises a multiplicity of said quantum well photodetectors, with the second surface of a given one of said photodetectors being patterned essentially identically to the second surface of any one of the other photodetectors.

3. An article according to claim 2, wherein the second surface of the given photodetector is patterned by a process that involves patterning of a processing layer on the second surface, and etching of exposed areas of the second surface.

4. An article according to claim 1, wherein a given of said patterning unit cells comprises at least a first and a second surface portion, with the second surface portion being a predetermined distance less than or equal to $\lambda'_p/2$ below the first surface portion, where $\lambda'_p$ is the peak wavelength of the radiation in the material adjacent to the second surface.

5. An article according to claim 4, wherein said given patterning unit cell further comprises a third surface portion, with the second and third surface portions being respectively $\lambda'_p/4$ and $\lambda'_p/2$ below the first surface portion.

6. An article according to claim 5, wherein said patterning unit cell is a square of size $U^2$, with the first, second and third surface portions being of size $U^2/4$, $U^2/2$ and $U^2/4$, respectively.

7. An article according to claim 4, wherein the given patterning unit cell is a square of size $U^2$, with U selected to be in the range $\lambda'_p \pm 50\%$.

8. An article according to claim 1, wherein the first major surface is a surface of a substrate, associated with the photodetector is a pixel size, and the thickness of the substrate is less than the pixel size.

9. An article according to claim 8, wherein the article comprises a multiplicity of said photodetectors, with the second surface of a given one of said photodetectors being patterned essentially identically to the second surface of any of the other photodetectors, said patterned second surface of the given photodetector comprising a multiplicity of square patterning unit cells of size $U^2$, with U selected to be in the range $\lambda'_p \pm 50\%$, where $\lambda'_p$ is the peak wavelength of the radiation in the material adjacent to the second surface.

* * * * *